(12) United States Patent
Jang et al.

(10) Patent No.: US 9,972,627 B2
(45) Date of Patent: May 15, 2018

(54) SEMICONDUCTOR DEVICE HAVING PASSING GATE AND METHOD FOR FABRICATING THE SAME

(71) Applicant: SK hynix Inc., Icheon (KR)

(72) Inventors: Tae Su Jang, Gwacheon (KR); Jeong Seob Kye, Suwon (KR)

(73) Assignee: SK HYNIX INC., Icheon (KR)

( * ) Notice: Subject to any disclaimer, the term of this patent is extended or adjusted under 35 U.S.C. 154(b) by 44 days.

(21) Appl. No.: 14/746,607

(22) Filed: Jun. 22, 2015

(65) Prior Publication Data

US 2016/0056160 A1 Feb. 25, 2016

(30) Foreign Application Priority Data

Aug. 21, 2014 (KR) .................. 10-2014-0109102

(51) Int. Cl.
| | |
|---|---|
| *H01L 27/108* | (2006.01) |
| *H01L 29/423* | (2006.01) |
| *H01L 29/06* | (2006.01) |
| *H01L 29/78* | (2006.01) |
| *H01L 29/49* | (2006.01) |

(52) U.S. Cl.
CPC .... *H01L 27/10823* (2013.01); *H01L 29/0649* (2013.01); *H01L 29/4236* (2013.01); *H01L 29/49* (2013.01); *H01L 29/7831* (2013.01)

(58) Field of Classification Search
CPC ........... H01L 27/10823; H01L 29/0649; H01L 29/4236; H01L 29/49; H01L 29/7831
See application file for complete search history.

(56) References Cited

U.S. PATENT DOCUMENTS

| 7,872,313 | B2 * | 1/2011 | Jung | ................. H01L 27/10808 257/374 |
| 8,975,140 | B2 * | 3/2015 | Chung | .............. H01L 21/76224 438/270 |
| 2010/0109075 | A1 | 5/2010 | Jung | |
| 2011/0076835 | A1 | 3/2011 | Jung | |
| 2011/0186924 | A1 | 8/2011 | Chun | |
| 2011/0260239 | A1 * | 10/2011 | Oyu | ..................... H01L 29/4236 257/330 |
| 2011/0260242 | A1 * | 10/2011 | Jang | ..................... H01L 21/265 257/331 |
| 2012/0286354 | A1 * | 11/2012 | Cho | .................. H01L 27/10876 257/330 |
| 2014/0110786 | A1 * | 4/2014 | Kim | .................. H01L 27/10876 257/365 |

FOREIGN PATENT DOCUMENTS

| KR | 10-2010-0050977 A | 5/2010 |
| KR | 10-2011-0090579 A | 8/2011 |
| KR | 10-2015-0015181 A | 2/2015 |

* cited by examiner

*Primary Examiner* — Laura Menz
*Assistant Examiner* — Candice Y Chan

(57) ABSTRACT

A semiconductor device that has a passing gate with a single gate electrode and a main gate with lower and upper gate electrodes mitigates gate induced drain leakage (GIDL). Additional elements that help mitigate GIDL include the upper gate electrode having a lower work function than the lower gate electrode, and the lower gate electrode being disposed below a storage node junction region while the upper gate electrode is disposed at a same level as the storage node junction region.

19 Claims, 8 Drawing Sheets

SEMICONDUCTOR DEVICE HAVING PASSING GATE AND METHOD FOR FABRICATING THE SAME

CROSS-REFERENCE TO RELATED APPLICATION

The priority of Korean patent application No. 10-2014-0109102 filed on 21 Aug. 2014, the disclosure of which is hereby incorporated in its entirety by reference, is claimed.

BACKGROUND OF THE INVENTION

Embodiments of the present disclosure relate to a semiconductor device and a method for fabricating the same, and more particularly to a semiconductor device having passing gates that prevents characteristics of a cell transistor from being deteriorated by the passing gate effect, and a method for fabricating the same.

In order to increase the degree of integration of a semiconductor device, the size of cell transistors are reduced. More specifically, as semiconductor devices are being developed to implement higher levels of integration, a preferred cell layout is changing from an $8F^2$ structure to a $6F^2$ structure.

As the degree of integration of semiconductor devices increases, the distance between a gate (word line) coupled to a cell transistor and a bit line coupled to the cell transistor is reduced. As a result, parasitic capacitance between the bit line and the gate may increase such that the operational reliability of the semiconductor device deteriorates. In order to improve the operational reliability of highly integrated semiconductor devices, a buried gate structure has been proposed in which a gate is buried within a semiconductor substrate. A conventional buried gate structure can be incorporated within a semiconductor device having a $6F^2$ layout, and can include a metal film as a gate electrode.

However, in a conventional buried gate structure, a portion of the buried gate electrode is disposed on the same level as a junction region that is adjacent to the buried gate. This causes Gate Induced Drain Leakage (GIDL) to occur where the buried gate electrode is on the same level as the junction region. More specifically, when a gate of a cell array of the semiconductor device is a line type gate, a portion of the buried gate disposed in a device isolation film and adjacent to an active region, which is referred to as a passing gate, is present in a conventional device. The passing gate may exacerbate the occurrence of GIDL. The GIDL discharges charges stored in the cell array, thereby deteriorating retention characteristics of the semiconductor device.

BRIEF SUMMARY OF THE INVENTION

Various embodiments of the present disclosure are directed to providing a semiconductor device having passing gates and a method for fabricating the same that substantially obviate one or more problems due to limitations and disadvantages of the related art.

An embodiment of the present disclosure relates to a semiconductor device configured to prevent deterioration of a cell transistor by reducing Gate Induced Drain Leakage (GIDL) caused by a passing gate.

In accordance with an aspect of the present invention, a semiconductor device includes: a device isolation film defining an active region; a main gate having first and second gate electrodes buried in the active region; and a passing gate having a single gate electrode buried in the device isolation film.

In accordance with an aspect of the present invention, a semiconductor device includes: a device isolation film defining an active region; a first gate electrode buried in the active region and the device isolation film; and a second gate electrode located over portions of the first gate electrode that are buried in the active region, and not disposed over portions of the first gate electrode that are buried in the device isolation film between adjacent active regions.

In accordance with an aspect of the present invention, a semiconductor device includes: a device isolation film defining an active region; a main gate having first and second gate electrodes provided in a first trench, the second gate electrode provided over the first gate electrode and having an upper surface provided within the first trench; a passing gate having a third gate electrode provided in a second trench, the third gate electrode having an upper surface provided within the second trench; and a dielectric film having first and second portions, the first portion extending into the first trench and having a lower end proximate to the upper surface of the second gate electrode, the second portion extending into the second trench an and having a lower end proximate to the upper surface of the third gate electrode, wherein the lower end of the second portion is at a lower level than the lower end of the first portion.

In accordance with an aspect of the present invention, a method for forming a semiconductor device includes: forming a device isolation film defining an active region; forming a gate trench by etching the active region and the device isolation film; forming a first gate electrode in the gate trench; forming a second gate electrode over the first gate electrode; selectively etching a portion of the second gate electrode in a passing gate region; and forming a capping film over the second gate electrode and the first gate electrode to cover portions of the first gate exposed by the selective etching.

The second gate electrode is formed by implanting one or more of nitrogen (N), oxygen (O), arsenic (As), aluminum (Al), and hydrogen (H) ions into an upper portion of the first gate electrode.

The selectively etching the second gate electrode includes etching a portion of the second gate electrode interposed between storage node junction regions of adjacent active regions.

The first gate electrode is disposed below the storage node junction regions, and the second gate electrode is disposed at a substantially same level as the storage node junction regions.

A work function of the first gate electrode is higher than a work function of the second gate electrode.

It is to be understood that both the foregoing general description and the following detailed description of embodiments are exemplary and explanatory.

BRIEF DESCRIPTION OF THE DRAWINGS

FIGS. 2A to 8A are plan views illustrating a method for forming the semiconductor device shown in FIG. 1A.

FIGS. 2B to 8B are cross-sectional views taken along line A-A' of FIGS. 2A to 8A, respectively.

DESCRIPTION OF EMBODIMENTS

Figure 1A:
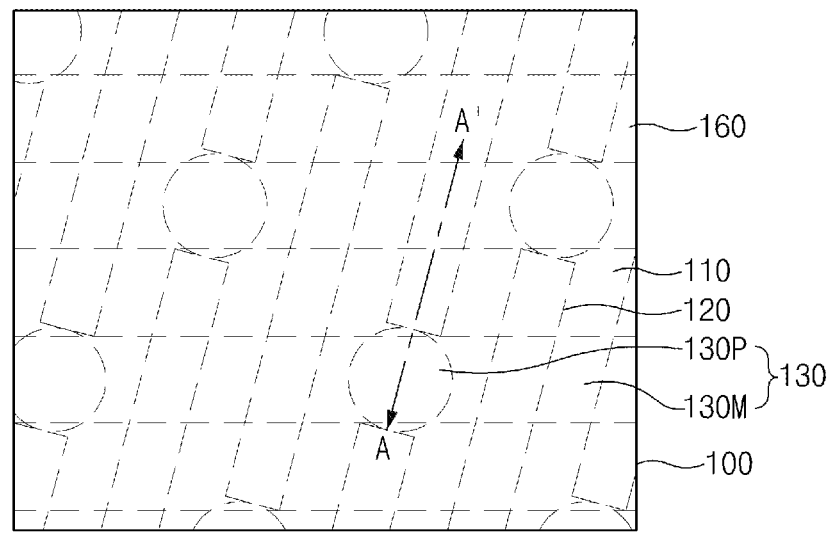
FIG. 1A is a plan view illustrating a semiconductor device according to an embodiment.

Reference will now be made in detail to certain embodiments, examples which are illustrated in the accompanying drawings. The embodiments described in the specification and shown in the drawings are purely illustrative and are not intended to represent the full scope of this disclosure, such that various equivalents and modifications may be made within the scope of this disclosure.

Figure 1B:
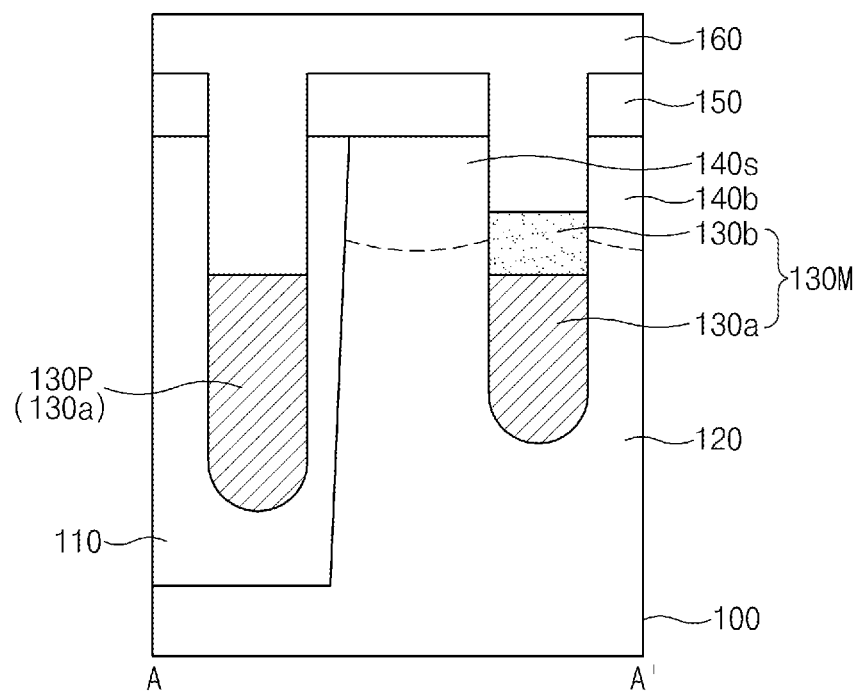
FIG. 1B is a cross-sectional view illustrating the semiconductor device taken along the line A-A' of FIG. 1A.

FIG. 1A is a plan view illustrating a semiconductor device according to an embodiment. FIG. 1B is a cross-sectional view illustrating the semiconductor device taken along the line A-A' of FIG. 1A.

Referring to FIGS. 1A and 1B, active regions 120 defined by a device isolation film 110 may be formed over a semiconductor substrate 100. Each active region 120 may cross two gates 130, and may be divided into three regions by the two gates 130. That is, each active region 120 is divided into a bit-line contact region disposed between two gates 130 and two storage node contact regions located at sides of the bit-line contact region. In other words, for each active region, a central portion of the active region may be a bit line contact region, and end portions of the active region may be storage node contact regions according to an implementation. In the active region 120, a bit-line junction region 140b is formed in the bit-line contact region, and storage node junction regions 140s are formed in the storage node contact regions.

The gate 130 may be a buried gate buried in a trench that runs through the active region 120 and the device isolation film 110. In such an embodiment, a portion of the buried gate 130 buried in the active region 120 is a main gate 130M, and a portion of the buried gate 130 that is buried in the isolation film 110 between adjacent storage node junction regions 140s is a passing gate 130P. In the embodiment shown in FIG. 1A, passing gates 130P are disposed at regions denoted by dotted circles. As seen in FIG. 1A, the passing gate 130P is located between opposing ends of adjacent active regions 120. The adjacent active regions 120 are arranged in a line that crosses gates 130.

Although the main gate 130M and the passing gate 130P are both described above as being portions of gate 130, the main gate 130M and the passing gate 130P have different structures. While the main gate 130M and the passing gate 130P may share a contiguous first gate electrode 130a, the main gate 130P may also include a second gate electrode 130b that is not disposed over the first electrode 130a of the passing gate. In other words, while the main gate 130M has two gate electrodes, the passing gate 130P only has a single gate electrode. The first gate electrode 130a may be referred to as a lower gate electrode 130a, while the second gate electrode 130b may be referred to as an upper gate electrode 130b. In an embodiment, the first gate electrode 130a material has a different work function than the second gate electrode 130b. In addition, the depth of the portion of the first gate electrode 130a disposed at the passing gate 130P may have a greater depth than the portion of the first gate electrode 130a disposed at the main gate 130M. In an embodiment, the main gate 130M includes a first gate electrode 130a having a high work function and a second gate electrode 130b having a lower work function than the first gate electrode 130a. In such an embodiment, the first gate electrode 130a may be disposed in a region that does not contact a junction region 140s, and the second gate electrode 130b may be formed in a region contacting the junction region 140s. More specifically, the first gate electrode 130a may be disposed at a lower level than storage node junction region 140s (e.g., the upper surface of the first gate electrode 130a is at a lower level than the lower surface of the storage node junction region 140s), while at least a portion of the second gate electrode 130b may be disposed at a same level as the storage node junction region 140s. In other words, a portion of second gate electrode 130b may overlap with storage node junction region 140s, while no portion of first gate electrode 130a overlaps the storage node junction region 140s. Each of these features—the passing gate 130P not having an upper second gate electrode 130b, and the first gate electrode 130a having a higher work function than second gate electrode 130b-helps to mitigate GIDL while maintaining good device performance.

In an embodiment, the first gate electrode 130a includes a metal material, for example, titanium (Ti), titanium nitride (TiN), tantalum nitride (TaN), tungsten (W), tungsten nitride (WN), etc. The second gate 130b may include a conductive layer with a lower work function than the first gate electrode 130a, such as N$^+$ polysilicon. Alternatively, the second gate electrode 130b may be formed by implanting at least one of nitrogen (N), oxygen (O), arsenic (As), aluminum (Al), and hydrogen (H) ions into the conductive film used to form first gate electrode 130a.

In addition, according to an embodiment, a gate trench in which the gate 130 is buried may have a fin structure in which the active region 120 protrudes more than the device isolation film 110. In other words, a depth of the passing gate 130P, which runs across device isolation film 110, is greater than a depth of the main gate 130M which runs across active region 120. Accordingly, the trench for gate 130 has different depths for a main gate region and a passing gate region.

A capping film 160 for isolating the gate 130 is formed over the buried gate 130. A pad insulation film pattern 150 that defines the trench for gate 130 and a capping film 160 are formed over the active region 120 and the device isolation film 110.

FIGS. 2A to 8A are plan views illustrating a method for forming the semiconductor device shown in FIG. 1A. FIGS. 2B to 8B are cross-sectional views taken along line A-A' of FIGS. 2A to 8A, respectively.

Figure 2A:
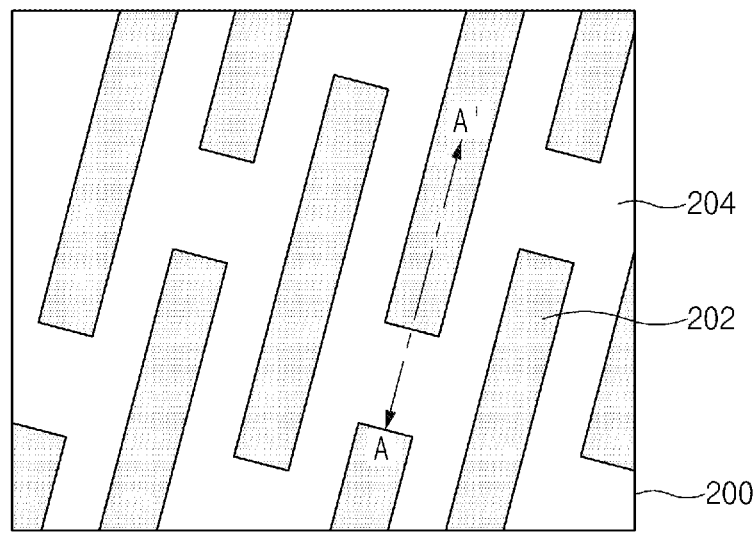
Figure 2B:
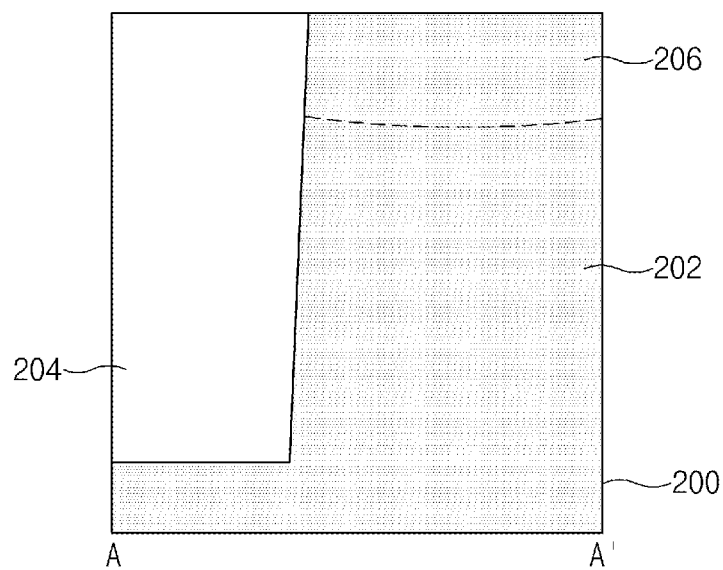

Referring to FIGS. 2A and 2B, a pad oxide film (not shown) and a pad nitride film (not shown) are formed over a semiconductor substrate 200, and a hard mask pattern (not shown) defining an active region 202 is formed over the pad nitride film. In order to form the hard mask pattern, after a line-type pattern is formed using a Spacer Pattern Technology (SPT) process, the line pattern is etched in units of a predetermined length corresponding to a length of an active region using a cut mask. The active region 202 may be formed to obliquely cross a gate formed in a subsequent process. In an embodiment, the gate is a word line.

Subsequently, the pad nitride film, the pad oxide film, and the semiconductor substrate 200 are sequentially etched using the hard mask pattern as an etch mask, resulting in a device-isolation trench that defines the active region 202. In this case, the etching process may be a dry etching process.

Subsequently, a sidewall insulation film (not shown) is formed at a sidewall of the device isolation trench. The sidewall insulation film may include a wall oxide film, and may be formed over a sidewall either by depositing an oxide film at a trench sidewall, or by a dry or wet etching method.

Subsequently, after a device isolation trench is filled with a device-isolation insulation film, the device-isolation insulation film is etched until the active region 202 is exposed, thereby forming a device isolation film 204 that defines the active region 202. In various embodiments, the device isolation film 204 may include a Spin On Dielectric (SOD) material or High Density Plasma (HDP) oxide film having superior gapfill characteristics. Alternatively, the device isolation film 204 may be a nitride film or a stacked structure of oxide film and nitride film.

Subsequently, impurities are implanted into the active region 202, thereby forming a junction region 206.

Figure 3A:
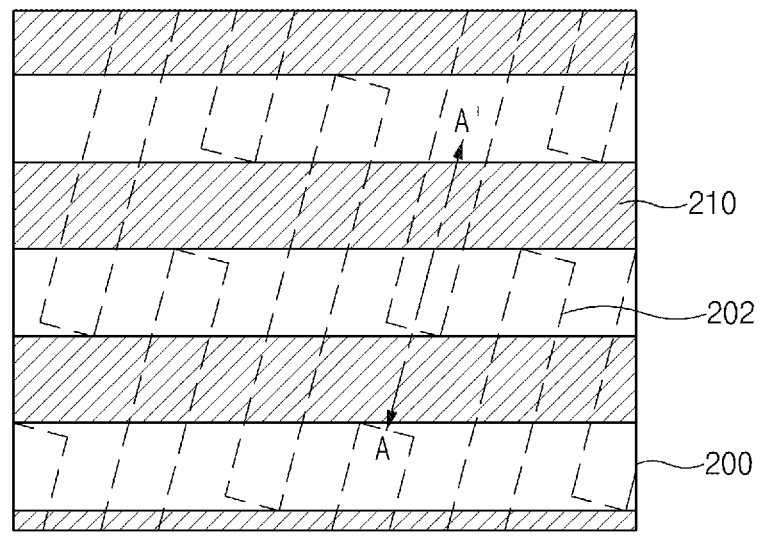
Figure 3B:
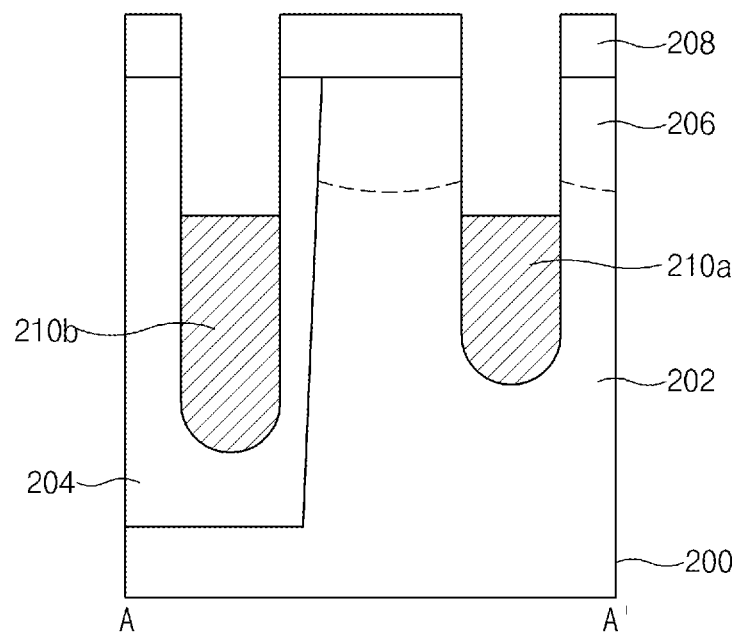

Referring to FIGS. 3A and 3B, a pad insulation film (not shown) is formed over the active region 202 and the device isolation film 204, and a photoresist pattern (not shown) defining a gate region is formed over a pad insulation film. Subsequently, the pad insulation film is etched using the photoresist pattern as an etch mask, thereby forming a pad insulation film pattern 208. The active region 202 and the device isolation film 204 are etched using the pad insulation film pattern 208 as an etch mask, thereby forming a gate trench for a buried gate.

The gate trench may be a substantially linear, or line type trench. The active region 202 and the device isolation film 204 are simultaneously etched to form the line-shaped trench. In an embodiment, the device isolation film 204 is more deeply etched than the active region 202 due to an etch selectivity between the active region 202 and the device isolation film 204. Therefore, the gate trench may have a fin structure in which the active region 202 is more protruded than the device isolation film 204 in the gate trench.

Subsequently, the bottom surface and a sidewall of the gate trench may be oxidized through an oxidation process, or an oxide film may be deposited through a deposition process, thereby forming a gate insulation film (not shown).

A conductive film is deposited in the gate trench until the gate trench is filled. The conductive film is planarized until the pad insulation film pattern 208 is exposed. In an embodiment, the planarization may be accomplished by a chemical mechanical planarization (CMP) process. Subsequently, the conductive film is etched back and cleaned, thereby forming first buried gate electrodes 210a and 210b. In various embodiments, the conductive film may include a metal material such as titanium (Ti), titanium nitride (TiN), tantalum nitride (TaN), tungsten (W), tungsten nitride (WN), etc.

For example, a thin titanium nitride (TiN) film or tantalum nitride (TaN) film may be conformally deposited in a gate trench, and a tungsten (W) film may then be deposited over the metal nitride film until the trench is filled. In other embodiments, a metal film is formed by stacking a titanium nitride (TiN) film and a tantalum nitride (TaN) film, or the titanium nitride (TiN) film, the tantalum nitride (TaN) film, and the tungsten (W) film are sequentially deposited, resulting in the first buried gate electrode.

Figure 4A:
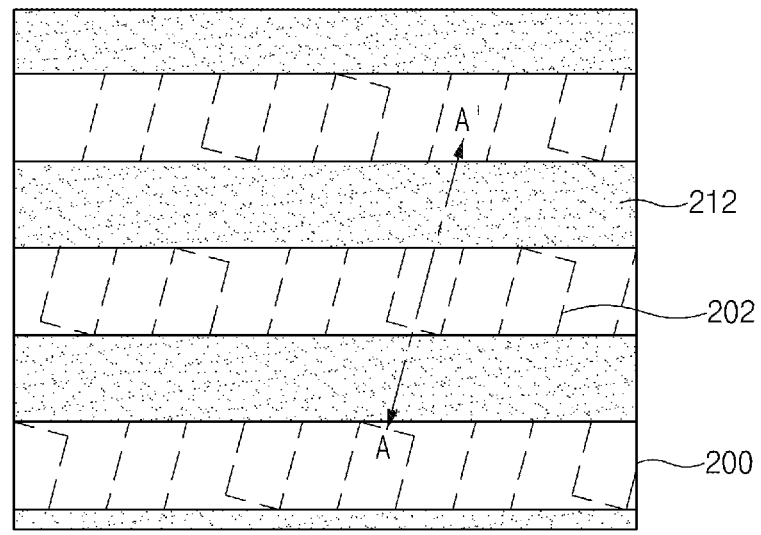
Figure 4B:
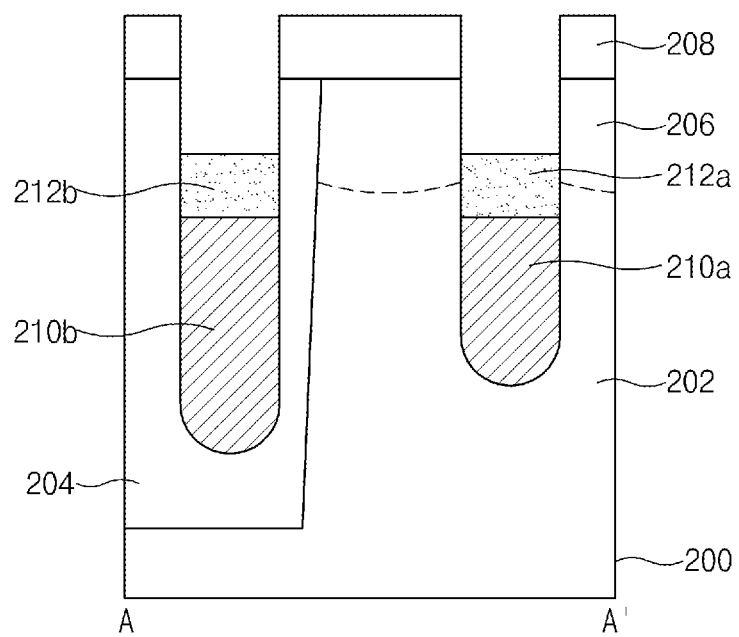

Referring to FIGS. 4A and 4B, a second gate conductive film is deposited over the first buried gate electrodes 210a and 210b until the gate trench is filled, and is then planarized. Subsequently, the planarized second-gate conductive film is etched back, so that the second buried gate electrodes 212a and 212b are formed over the first buried gate electrodes 210a and 210b.

The second gate conductive film may be formed of a conductive material having a lower work function than the first gate conductive film. In an embodiment, the second gate conductive film includes $N^+$ polysilicon.

Alternatively, the second buried gate electrodes 212a and 212b may be formed by implanting at least one of nitrogen (N), oxygen (O), arsenic (As), aluminum (Al), and hydrogen (H) ions into an upper portion of the first buried gate electrodes 210a and 210b. For example, a first gate conductive film may be deposited in the gate trench, planarized, and etched back to the height of second buried gate electrodes 212a and 212b as shown in FIG. 4B. Subsequently, nitrogen (N) ions may be implanted into an upper portion of the buried gate electrodes, thereby forming second gate electrodes 212a and 212b which are doped with nitrogen ions over first gate electrodes 210a and 210b which are not doped with nitrogen ions.

In another embodiment, a barrier film is formed at an upper portion of the first buried gate electrodes 210a and 210b. In such an embodiment, nitrogen ions are implanted into an upper portion of the first buried gate electrodes 210a and 210b, thereby forming a barrier film. Such a barrier film reduces contact resistance between the first buried gate electrodes 210a and 210b and second buried gate electrodes 212a and 212b that are subsequently formed over the first buried gate electrodes 210a and 210b.

Figure 5A:
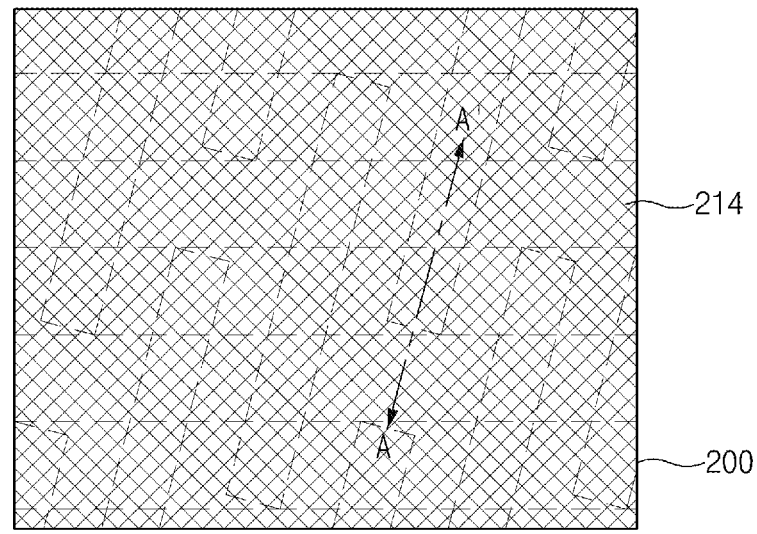
Figure 5B:
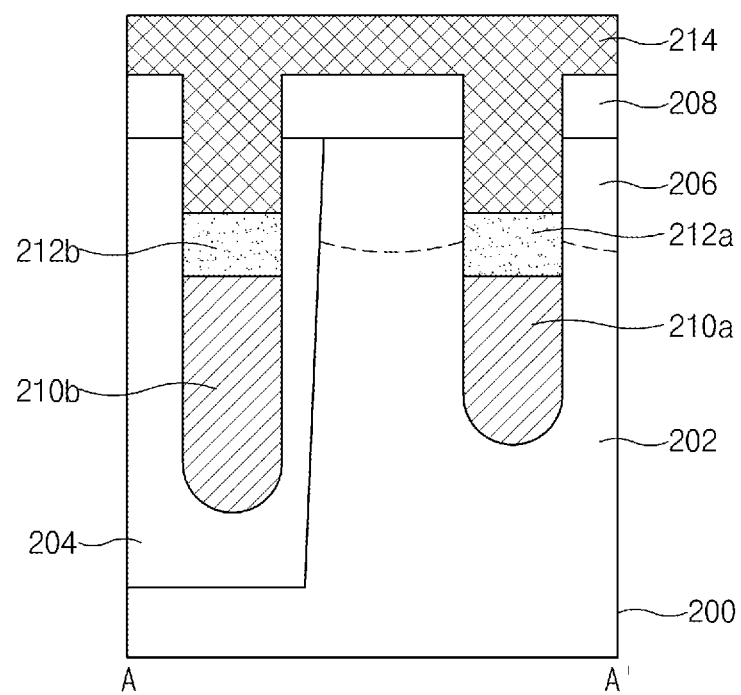

Referring to FIGS. 5A and 5B, an insulation film 214 is deposited over the second buried gate electrodes 212a and 212b and the pad insulation film pattern 208 until the gate trench is filled, and the insulation film 214 is then planarized. The insulation film 214 may include an oxide film deposited by a spin-on dielectric (SOD) or high density plasma (HDP) process.

Figure 6A:
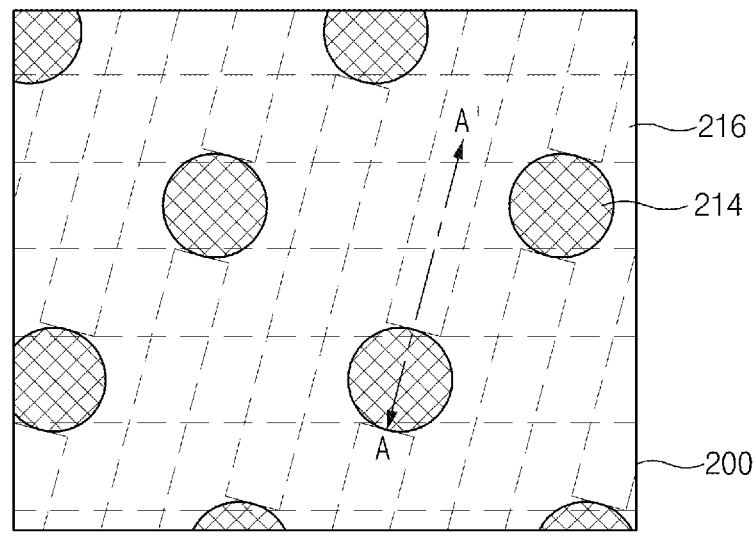
Figure 6B:
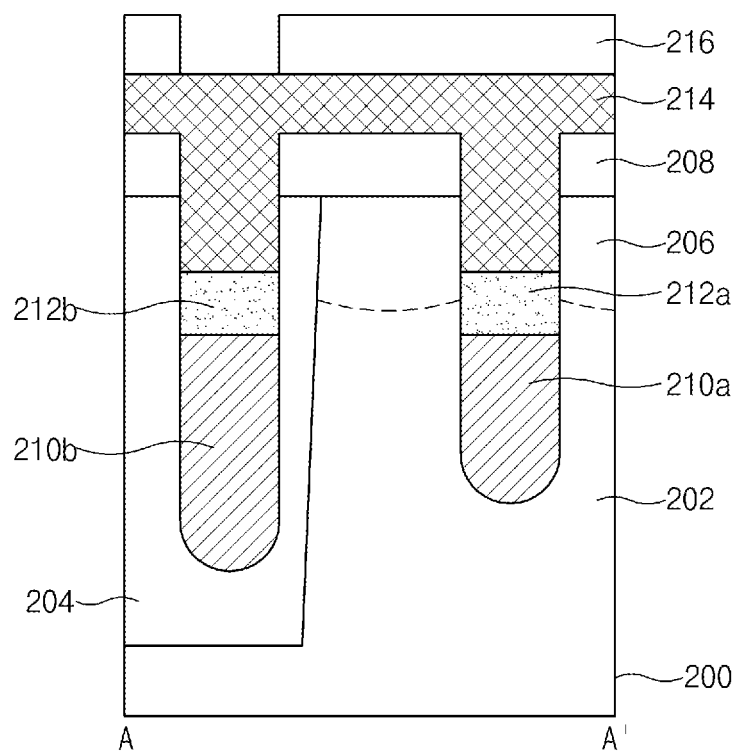

Referring to FIGS. 6A and 6B, a passing-gate open mask pattern 216 with openings over the passing gate regions is formed over the insulation film 214. The passing gate open mask pattern 216 may be a hole-type mask pattern. In an embodiment, the cut mask that has been used to form a hard mask pattern defining the active region 202 as explained with respect to FIG. 2A may be used as a mask to form the passing gate open mask pattern 216.

Figure 7A:
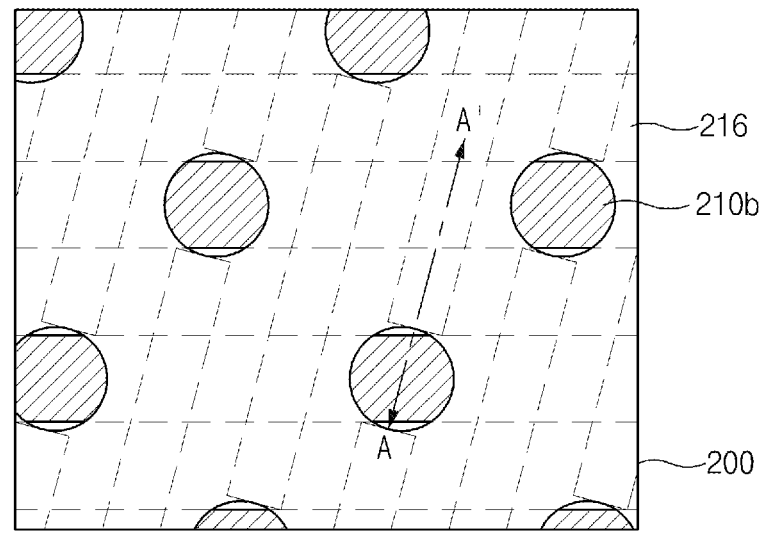
Figure 7B:
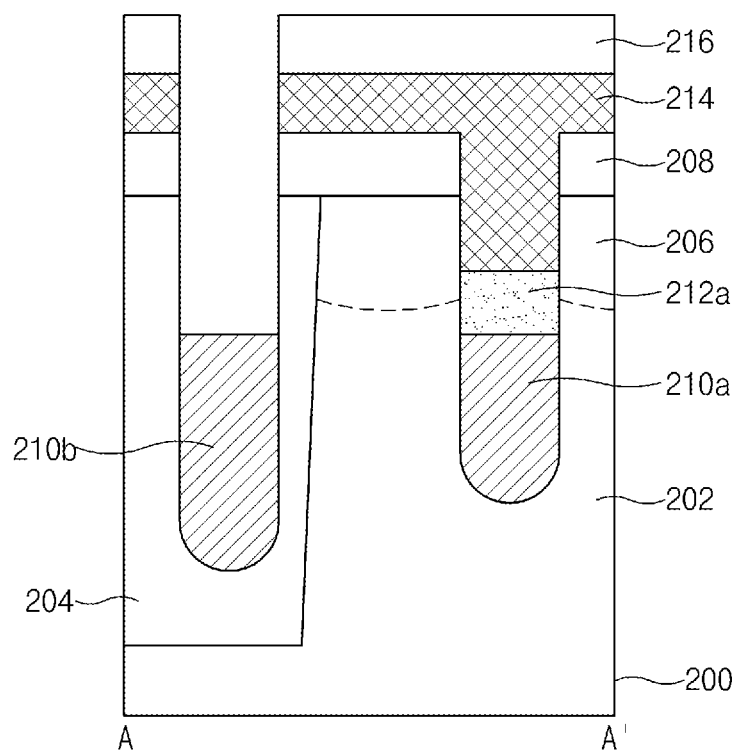

Referring to FIGS. 7A and 7B, the insulation film 214 of the passing gate region and the second buried gate electrode 212b are removed by an etching process using the passing gate open mask pattern 216 as an etch mask.

Figure 8A:
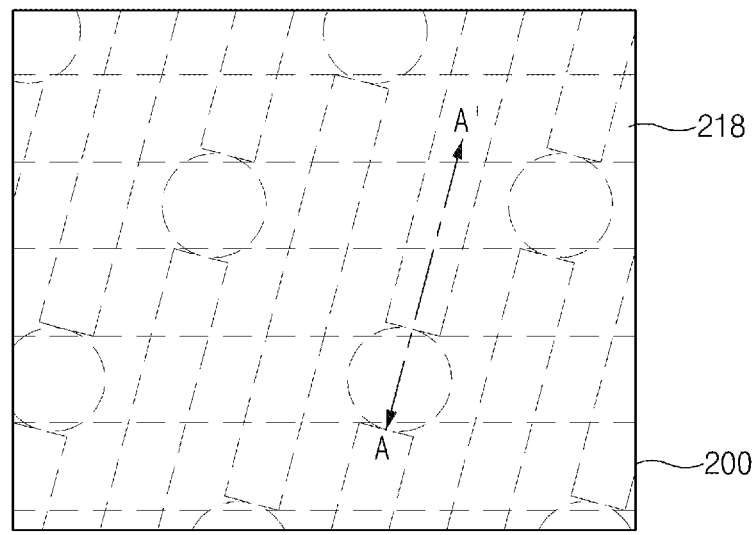
Figure 8B:
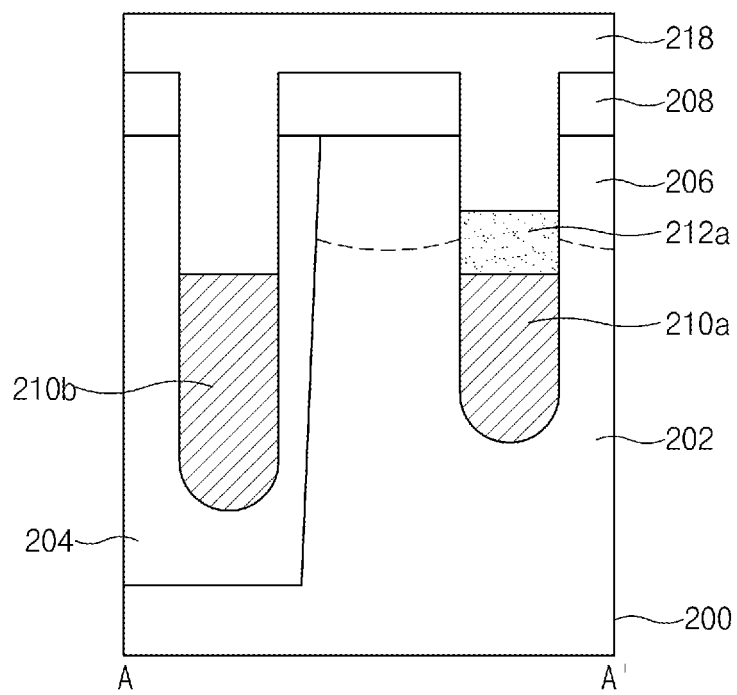

Referring to FIGS. 8A and 8B, the remaining portions of insulation film 214 and the passing gate open mask pattern 216 are removed, and the capping film 218 is formed over the first buried gate electrode 210b and the second buried gate electrode 212a to fill the gate trench. The capping film 218 may be formed to insulate and protect the buried gates, and may include a nitride film or an oxide film. In an embodiment, the buried gates include a stacked structure of a nitride film and an oxide film.

As is apparent from the above description, embodiments of the present disclosure can reduce GIDL caused by a passing gate to prevent characteristics of the cell transistor from being deteriorated, so that a data retention time can be improved and the reliability achieved after packaging completion can also be improved.

Those skilled in the art will appreciate that embodiments of the present disclosure may be carried out in other ways than those set forth herein without departing from the spirit and characteristics of these embodiments. The above embodiments are therefore to be construed in all aspects as illustrative and not restrictive. For example, the embodiments may be implemented in a layout configuration other than $6F^2$ structure, e.g., $4F^2$ structure.

Various alternatives and equivalents to the specifically described embodiments are possible. Embodiments are not limited by the type of deposition, etching polishing, and patterning steps described herein. Nor is the disclosure limited to any specific type of semiconductor device. For example, embodiments may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A semiconductor device comprising:
a device isolation film defining an active region; and
a gate having a main gate part and a passing gate part, and buried in the active region and the device isolation film,
wherein the main gate has first and second gate electrodes, and is buried in the active region, and
the only gate electrode for the passing gate is the first gate electrode, and the passing gate is buried in the device isolation film.

2. The semiconductor device according to claim 1, wherein the first gate electrode is provided below the second gate electrode, and
wherein the first gate electrode has a first work function and the second gate electrode has a second work function, the second work function being lower than the first work function.

3. The semiconductor device according to claim 2, wherein the first gate electrode is disposed at a lower level than a junction region of the active region.

4. The semiconductor device according to claim 2, wherein the second gate electrode is formed at a substantially same level as a junction region of the active region.

5. The semiconductor device according to claim 2, wherein the passing gate and the main gate are both disposed in a same line-type gate trench.

6. The semiconductor device according to claim 2, wherein the passing gate is located between adjacent storage node junction regions.

7. The semiconductor device according to claim 6, wherein the passing gate is disposed below the storage node junction regions.

8. The semiconductor device according to claim 2, wherein the second gate electrode includes one or more of nitrogen (N), oxygen (O), arsenic (As), aluminum (Al), and hydrogen (H) ions implanted into a conductive material of the first gate electrode.

9. A semiconductor device comprising:
a device isolation film defining an active region;
a first gate electrode provided in a first trench, the first trench formed within the active region and the device isolation film; and
a second gate electrode provided within the first gate trench and located over portions of the first gate electrode that are buried in the active region, and not disposed over portions of the first gate electrode that are buried in the device isolation film between adjacent active regions.

10. The semiconductor device according to claim 9, wherein each of the adjacent active regions includes a storage node junction region.

11. The semiconductor device according to claim 9, wherein the first gate electrode is formed at a lower level than a junction region of the adjacent active regions.

12. The semiconductor device according to claim 11, wherein the second gate electrode is formed at a substantially same level as the junction region of the active regions.

13. The semiconductor device according to claim 9, wherein the first gate electrode and the second gate electrode have different work functions, the first gate electrode being provided below the second gate electrode.

14. The semiconductor device according to claim 13, wherein the second gate electrode has a lower work function than the first gate electrode.

15. The semiconductor device according to claim 14, wherein the second gate electrode includes one or more of nitrogen (N), oxygen (O), arsenic (As), aluminum (Al), and hydrogen (H) ions implanted into a conductive material of the first gate electrode.

16. A semiconductor device comprising:
a device isolation film defining an active region;
a main gate having first and second gate electrodes provided in a first trench, the second gate electrode being provided over the first gate electrode and having an upper surface provided within the first trench;
a passing gate having only a third gate electrode provided in a second trench, the third gate electrode having an upper surface provided within the second trench; and
a dielectric film having first and second portions, the first portion extending into the first trench and having a lower end proximate to the upper surface of the second gate electrode, the second portion extending into the second trench and having a lower end proximate to the upper surface of the third gate electrode,
wherein the lower end of the second portion is at a lower level than the lower end of the first portion.

17. The semiconductor device of claim 16, wherein the first gate electrode and the third gate electrode comprise substantially the same material.

18. The semiconductor device of claim 16, further comprising:
a bit-line contact region; and
a storage node contact region provided between the main gate and the passing gate,
wherein the main gate is provided between the bit line contact region and the storage node contact region.

19. The semiconductor device of claim 18, wherein each active region defines first and second storage node contact regions and a bit-line contact region, and
wherein the device defines a layout configuration of $6F^2$.

* * * * *